(12) United States Patent
Khayat et al.

(10) Patent No.: US 10,289,484 B2
(45) Date of Patent: May 14, 2019

(54) APPARATUSES AND METHODS FOR GENERATING PROBABILISTIC INFORMATION WITH CURRENT INTEGRATION SENSING

(71) Applicant: MICRON TECHNOLOGY, INC., Boise, ID (US)

(72) Inventors: Patrick R. Khayat, San Diego, CA (US); Sivagnanam Parthasarathy, Carlsbad, CA (US); Mustafa N. Kaynak, San Diego, CA (US); Mark A. Helm, Santa Cruz, CA (US); Aaron S. Yip, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 123 days.

(21) Appl. No.: 15/267,844

(22) Filed: Sep. 16, 2016

(65) Prior Publication Data
US 2018/0081753 A1  Mar. 22, 2018

(51) Int. Cl.
| | | |
|---|---|---|
| G06F 11/00 | (2006.01) | |
| G06F 11/10 | (2006.01) | |
| G06F 3/06 | (2006.01) | |
| G11C 16/08 | (2006.01) | |
| G11C 16/26 | (2006.01) | |

(Continued)

(52) U.S. Cl.
CPC .......... *G06F 11/1068* (2013.01); *G06F 3/064* (2013.01); *G06F 3/0619* (2013.01); *G06F 3/0679* (2013.01); *G11C 16/08* (2013.01); *G11C 16/26* (2013.01); *G11C 29/52* (2013.01); *H03M 13/1177* (2013.01); *H03M 13/3723* (2013.01); *H03M 13/612* (2013.01);

(Continued)

(58) Field of Classification Search
None
See application file for complete search history.

(56) References Cited

U.S. PATENT DOCUMENTS

| | | |
|---|---|---|
| 7,966,546 B2 | 6/2011 | Mokhlesi et al. |
| 9,442,797 B2 | 9/2016 | Shin |

(Continued)

OTHER PUBLICATIONS

International Search Report and Written Opinion dated Nov. 28, 2017 for PCT Application No. PCT/US2017/047925.

(Continued)

*Primary Examiner* — Daniel F. McMahon
(74) *Attorney, Agent, or Firm* — Dorsey & Whitney LLP

(57) ABSTRACT

Methods and apparatuses for determining likelihood of erroneous data bits stored in a plurality of memory cells. A sense circuit to perform a coarse sense operation to detect first memory cells of the plurality of memory cells that stored charge sufficiently above a transition voltage threshold where the first memory cells are unlikely to be erroneous. The sense circuit further performs a fine sense operation to sense second memory cells of the plurality of memory cells having stored charge near the transition voltage between adjacent logic states. The first memory cells remain unsensed during the fine sense operation. The second memory cells detected during the fine sense operation may have an increased likelihood of being erroneous. Responsive to a number of sensed second memory cells near the transition voltage exceeding a threshold, additional sensing operations are performed by the sense circuit.

22 Claims, 9 Drawing Sheets

(51) Int. Cl.
    *G11C 29/52*    (2006.01)
    *H03M 13/11*    (2006.01)
    *H03M 13/37*    (2006.01)
    *H03M 13/00*    (2006.01)
    *G11C 29/04*    (2006.01)
    *H03M 13/29*    (2006.01)

(52) U.S. Cl.
    CPC .. *G11C 2029/0411* (2013.01); *H03M 13/1111* (2013.01); *H03M 13/2909* (2013.01)

(56) References Cited

U.S. PATENT DOCUMENTS

| | | | | |
|---|---|---|---|---|
| 2011/0161775 A1* | 6/2011 | Weingarten | ......... | G06F 11/1048 714/755 |
| 2013/0107611 A1 | 5/2013 | Cai et al. | | |
| 2013/0205075 A1* | 8/2013 | Twitto | ................... | G11C 16/26 711/103 |
| 2014/0082440 A1* | 3/2014 | Ho | ................... | G11C 29/50004 714/721 |
| 2014/0089764 A1* | 3/2014 | Goldman | ............ | G06F 11/1048 714/773 |
| 2014/0281800 A1 | 9/2014 | Micheloni et al. | | |
| 2014/0355340 A1* | 12/2014 | Sharon | ................... | G11C 16/26 365/185.03 |
| 2016/0099048 A1 | 4/2016 | Tang et al. | | |

OTHER PUBLICATIONS

First Office Action for TW Application No. 106129329, dated Mar. 12, 2018.

Translation of Second Office Action for TW patent application No. 106129329 dated Oct. 23, 2018; pp. all.

English Translation of Office Action for TW appiicatian No. 106129329 dated Feb. 14, 2019; pp. all.

* cited by examiner

APPARATUSES AND METHODS FOR GENERATING PROBABILISTIC INFORMATION WITH CURRENT INTEGRATION SENSING

BACKGROUND

Low-density parity check (LDPC) codes are becoming increasingly common for error correction in memory devices. LDPC codes are a class of capacity approaching codes, capable of achieving the highest theoretically correctable raw bit error rate (RBER) given a particular error correction code (ECC) code rate. Most LDPC codes are decoded based on belief propagation decoding. Belief propagation decoding means that the LDPC decoder uses probabilistic or "soft" information for each bit to estimate the likelihood of a particular bit being in error based on the constraints of the code. Probabilistic information may be represented in the form of a log likelihood ratio (LLR) which uses a logarithmic scale to express confidence that the purported value of a bit that was sensed is the actual value of that bit. In many memory devices, if a hard read operation (simply sensing the cells and returning the data sensed from the cell) fails, meaning that LDPC decoder indicates that one or more cells may have an erroneous bit after decoding, then the cells are sensed additional times in order to perform decoding in accordance with a soft-input LDPC code decoder. By performing multiple read strobes on each memory cell being read, probabilistic information is generated for the LDPC decoder in order to determine and correct erroneous bits in the data. Based on the probabilistic information and/or the sensed bit, the LDPC decoder can reconstruct the valid codeword and recover the data that was lost when transmitted over a noisy channel.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

As discussed above, many LDPC codes rely on probabilistic information in order to decode data retrieved from memory. Typical memory devices extract the probabilistic information by performing multiple read strobes on each cell being read. Based on the values read from the cells during the multiple read strobes, probabilistic information may be constructed. For example, if a particular cell retains the same value or values through all of the multiple read strobes, then the probabilistic information may indicate that the cell has a strong likelihood of having an actual value that is the same as the sensed value. Alternatively, if the value read from cell changes during the multiple read strobes, the probabilistic information may indicate that the value read from the cell may be erroneous. Based on the number of strobes used and the number of times that a cell reads out each possible value, a range of probabilistic information may be generated in order to ensure that the cell is corrected, if needed. Performing multiple read strobes has a number of adverse side effects on memory performance. Performing multiple strobes takes time, and the additional time required for the multiple read strobes negatively affects memory response time, latency, and compliance with timing requirements. Performing multiple read strobes can increase power consumption of the memory device. Because each read strobe generates separate read data, the amount of data that must be transferred through the memory interface increases, which can negatively affect interface bandwidth and latency.

Figure 1:
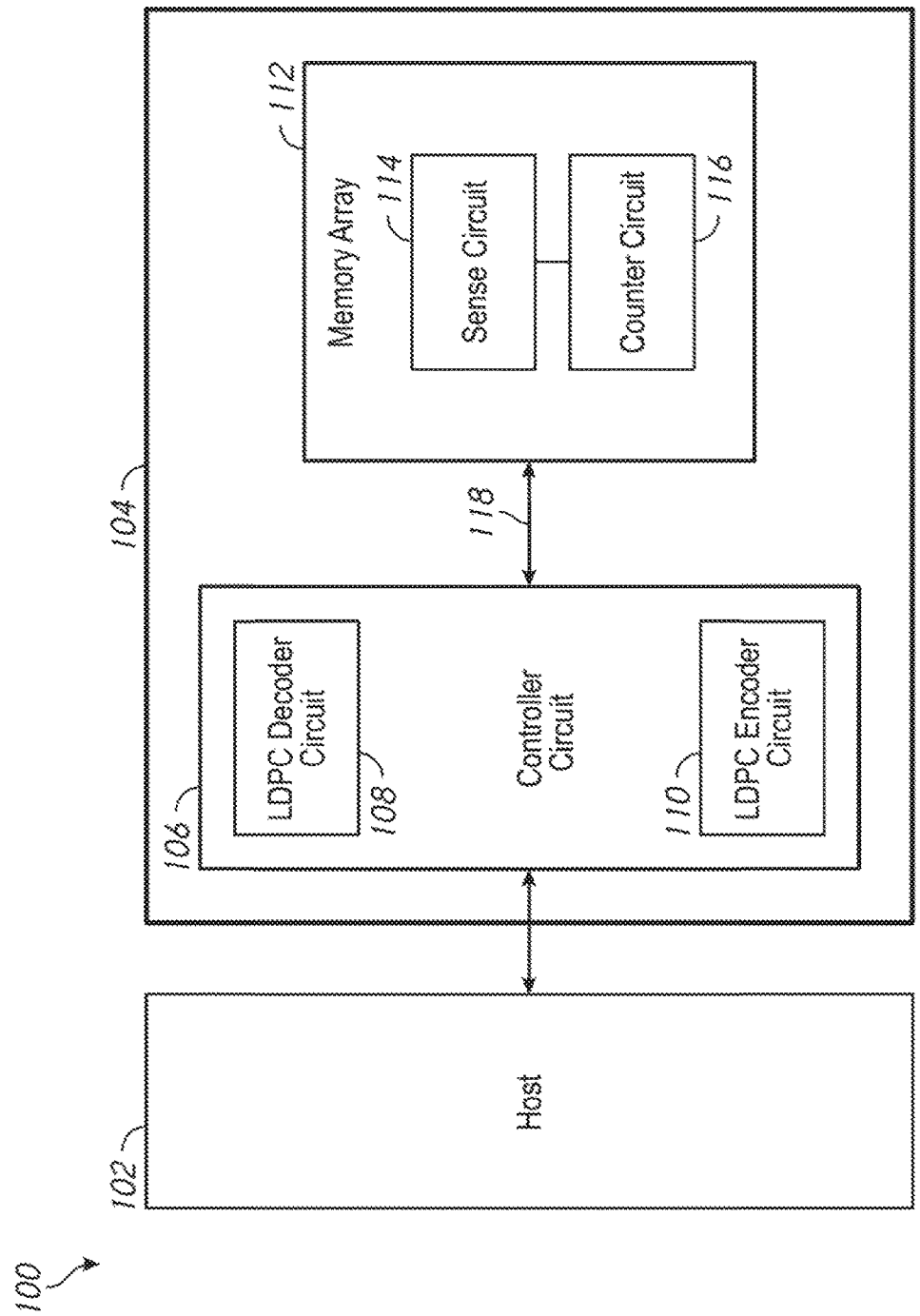
FIG. 1 is a block diagram of a computing system including a memory device, in accordance with an embodiment of the present invention.

FIG. 1 is a block diagram of computing system, generally designated 100, including host 102 and a memory device 104, in accordance with an embodiment of the present invention. The memory device 104 may include a control circuit 106. The control circuit 106 may include an LDPC decoder circuit 108 and an LDPC encoder circuit 110. The memory device 104 may further include a memory array 112 coupled to the control circuit 106 over a noisy channel 118. The memory array 112 may include a plurality of memory cells (See FIG. 2), a sense circuit 114, and a counter circuit 116 coupled to the sense circuit 114.

The host 102 may be, for example, a processor based system such as a laptop computer, smartphone, server computer, desktop computer, tablet, personal digital assistant, or any other electronic device capable of communicating with the memory device 104.

The memory device 104 may generally be any type of memory device that is configured to perform ECC using LDPC codes (or similar codes that use probabilistic information) and is configured to sense cells using current integration techniques, as described in further detail below. The control circuit 106 may generally be any circuit, device, or other system configured to receive commands from the host 102, direct memory operations for the memory array 112 (e.g., read and write commands), and to provide data to the host in response to the received commands, if appropriate (e.g., in response to a read command). The LDPC encoder circuit 110 may be a circuit, device, or system configured to encode data in accordance with an LDPC code for storage in the memory array 110. The LDPC decoder circuit 108 may be a circuit, device, or system configured to perform decode operations on data received from the memory array 112 based on probabilistic information provided by the sense circuit 114, in accordance with the LDPC code rules. Those skilled in the art will appreciate that the LDPC encoder circuit 110 and the LDPC decoder circuit 108 may be implemented in a number of different ways based on the particular LDPC encoding scheme used to encode the data.

The memory array 112 may generally be any type of memory array capable of being sensed using current integration techniques. For example, the memory array 112 may include a plurality of NAND flash memory cells. The plurality of NAND flash memory cells may be single level cells (SLCs) or multilevel cells (MLCs). The sense circuit 114 may be configured to sense one or more cells in the memory array 112 using a current integration technique to generate sense data indicative of the values stored on the one or more cells. The sense data may be used to generate probabilistic information for performing an LDPC decode operation using the LDPC decoder circuit 110. An example sense circuit is described in further detail below with respect to FIG. 3. The counter circuit 116 may be a circuit configured to maintain a count of cells having a high uncertainty regarding the value of the bits stored by the cell.

In operation, the host 102 may provide a command to the control circuit 106 requesting data that is stored in the memory array 112. The control circuit 106 may instruct the memory array 112 to return the requested data. The sense circuit 114 may sense the cells storing the requested data using a current integration technique to generate probabilistic information. Based on the results of the sense operation, the memory array 112 may return the requested data and associated probabilistic information to the control circuit 106 over the noisy channel 118. Based on the received data, the control circuit 106 may decode the data with the LDPC decoder circuit 108 and correct any erroneous bits using the probabilistic information provided by the sense circuit 114. The sense circuit 114 may also record a number of sensed cells in the counter circuit 116 that were determined to be at or near the threshold voltage for the sense operation. If the number of cells in the counter circuit 116 exceeds a threshold value, then additional sensing may be performed by the sense circuit 114 to refine the probabilistic information and improve the probability of codeword correction during the LDPC decode operation.

Figure 2:
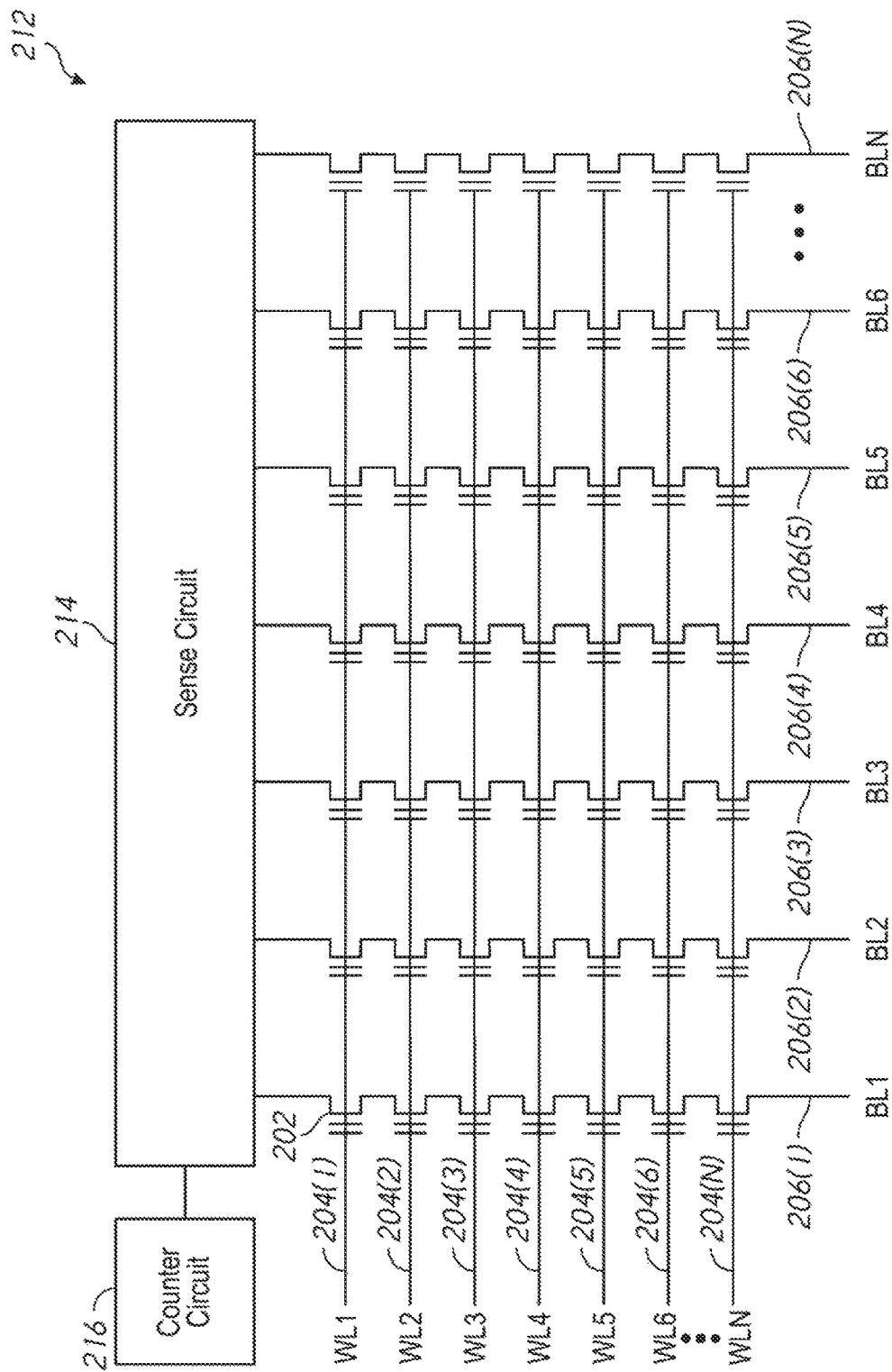
FIG. 2 is a schematic diagram of a memory array, in accordance with an embodiment of the present invention.

FIG. 2 is a schematic diagram of a memory array, generally designated 212, in accordance with an embodiment of the present invention. The memory array 212 includes a plurality of memory cells 202, a plurality of wordlines 204(1)-(N), a plurality of bitlines 206(1)-(N), a sense circuit 214, and a counter circuit 216. The memory array 212 may be implemented as the memory array 112 of FIG. 1. Each of the memory cells 202 may be, for example, MLC NAND flash cells. Other types of memory cells may also be used. Each of the bitlines 206(1)-(N) may include a plurality of memory cells 202 coupled in series to the sense circuit 214. The respective gates of the memory cells 202 may be coupled to one of the wordlines 204(1)-(N). In various embodiments, each of the wordlines 204(1)-(N) may be coupled to a memory cell 202 of each of the bitlines 206(1)-(N).

Each of the memory cells 202 may have charge stored thereon. The amount of charge stored on each memory cell 202 may be indicative of one of a number of logic states. For example, a multilevel memory cell configured to store two bits may have four possible logic states (e.g., 11, 01, 00, and 10). Because the various charge regions for each logic state are adjacent to one another, when a memory cell 202 is detected near the threshold voltage between logic levels, there is less certainty that the memory cell 202 is in the correct logic state. Therefore, there is a greater probability that the memory cell 202 is in error and must be corrected during an LDPC decode operation. Because the amount of charge stored on the memory cells 202 varies based on the logic state, the rate at which cells discharge during a sense operation also varies based on the logic state of the memory cell 202. During current integration sensing, multiple sense operations may be performed that are configured to detect the values stored on the memory cells 202 at different times to determine whether the memory cell 202 has a given value stored thereon. For example, those memory cells 202 that are well above the threshold for a particular logic state will discharge more quickly during a sense operation. Accordingly, these memory cells 202 are detectable earlier in the sense operation than other memory cells 202. Those memory cells 202 having a stored charge that is close to the threshold will discharge more slowly during a sense operation. Accordingly, a second sense operation is performed at a later time to detect those memory cells 202 that are close to the threshold voltage.

The sense circuit 214 may be configured to sense values stored in the memory cells 202 using a current integration technique and provide probabilistic information to the control circuit (See FIG. 1) for use in an LDPC decode operation. The sense circuit 214 may perform a number of sense operations (e.g., 2). For example, the sense circuit 214 may be configured to perform a first sense operation intended to detect memory cells 202 that are in a first logic state and sufficiently above the transition voltage between the logic state to be detected and an adjacent logic state such that the memory cells 202 have a high probability of being sensed in the correct logic state. The first sense operation may be a "coarse" sense operation meaning that the first sense operation is configured to detect those memory cells 202 that are sufficiently above the threshold such that the memory cells are unlikely to be erroneous. Accordingly, the memory cells 202 detected during the coarse sense operation may be associated with probabilistic information (e.g., a high LLR) indicating that the sensed cells are unlikely to be erroneous. A second sense operation may be a "line" sense operation configured to sense those cells that have charge stored thereon that is near the transition voltage between adjacent logic, states. Those memory cells 202 detected during a fine sense operation may have an increased likelihood of being erroneous compared to those cells sensed during the coarse sense operation. Accordingly, the memory cells 202 detected during the fine sensing operation may have a lower LLR associated with them for use during an LDPC decode operation. The operation of the sense circuit 214 is described in further detail below with respect to FIG. 3. The counter circuit 216 may maintain a count of a number of sensed memory cells 202 that are at or near the threshold voltage for a given value. If the number of memory cells 202 stored in the counter circuit 216 exceeds a threshold value, then additional sensing operations may be performed by the sense circuit 214 on the memory cells 202 in order to obtain more refined probabilistic information for use in the LDPC decode operation, as described below with respect to FIG. 8.

Figure 3:
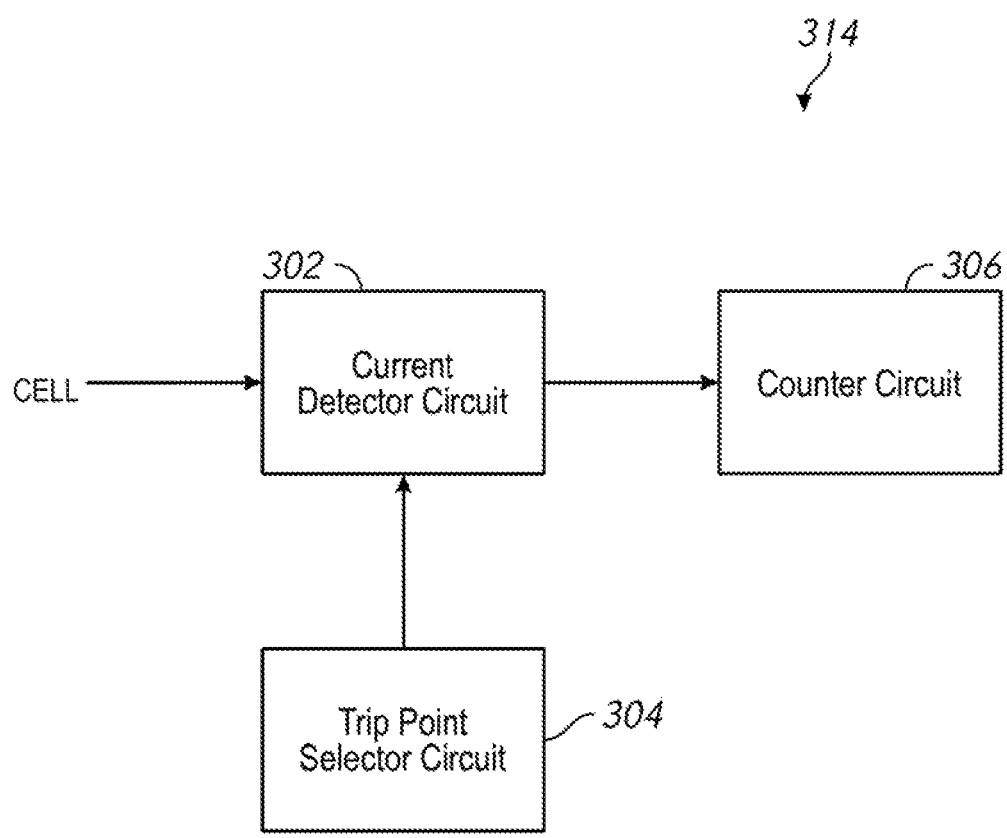
FIG. 3 is an example sense circuit, in accordance with an embodiment of the present invention.

FIG. 3 is an example sense circuit, generally designated 314, in accordance with an embodiment of the present invention. The sense circuit 314 may be implemented as, the sense circuit 214 of FIG. 2 or the sense circuit 114 of FIG.

1. The sense circuit 314 generally includes a current detector circuit 302, a trip point selector circuit 304, and a counter circuit 306.

The current detector circuit 302 detects cell current flowing through one or more bitlines. In various embodiments, the current detector circuit may precharge a bitline to a predetermined voltage. The predetermined voltage may then be discharged through the memory cells coupled to the bitline, generating a cell current $I_{CELL}$. The cell current depends on the voltage on the cell. As discussed above, the cells may be multilevel cells where different logic states depend on the voltage stored on the cell. The particular voltage level that defines a boundary between logic states may generally be referred to as a threshold voltage. Those cells having voltages stored thereon that are sufficiently below the threshold voltage may discharge more quickly than those cells that have voltages stored thereon that are near the threshold voltage. Therefore, by varying the time at which the current detector circuit 302 detects the cell current, the sense circuit 314 may determine whether a the cell voltage is below a sense voltage.

The current detector circuit 302 may include a sense latch that detects those cells having a cell voltage below the sense voltage in response to strobe signals. By detecting cells using multiple strobe signals, as is common in current integration, cells may be identified as being at or near the threshold voltage between logic states. For example, if the current detector circuit 302 detects the cell current at a first time, the current detector circuit 302 may determine cells that have a cell voltage below a first value. A second sense operation, performed in response to a strobe signal at a second time, may detect cells that have a cell voltage that is between the first value and a second value. Thus, by performing multiple detections spaced out over time, the current detection circuit may identify and categorize cells into various voltage ranges based on the detected cell current, which corresponds to the voltage stored on the cells. The trip point selector circuit 304 determines when the current detector circuit 302 detects the cell current. The trip point selector circuit 304 may be configured to initiate cell current detection using a current integration technique. That is, the trip point selector circuit 304 may instruct the current detector circuit 302 to perform a first, coarse sense operation to detect cells that have voltages stored thereon that are not near the threshold between logic levels. For the coarse sense operation, the trip point selector circuit 304 may instruct the current detector circuit to perform a first sense operation at a first sense voltage that is below the threshold voltage between logic levels. The trip point selector circuit 304 may then instruct the current detector circuit to perform a second, fine sense operation to detect cells that have voltages stored thereon that are at or near the threshold voltage between logic levels. For the fine sense operation, the trip point selector circuit 304 may instruct the current detector circuit 302 to perform a sense operation at a second sense voltage that is equal to the threshold voltage between logic states The counter circuit 306 may be any type of memory circuit, such as a register, that may store the number of cells detected that are at or near the voltage threshold between logic levels. That is, the counter circuit 306 stores the number of cells that are detected by the fine sensing operation. If the number of cells detected that are at or near the threshold voltage, then the trip point selector circuit may instruct the current detector circuit to perform another sense operation to detect cells that have a voltage stored thereon that is between the second sense voltage and a third sense voltage that is greater than the threshold voltage.

Those memory cells that are detected by the first strobe signal may associated with probabilistic information indicating that the detected memory cells are not near the transition voltage between logic states and therefore, the detected logic level is unlikely to be erroneous. For example, the value may be a large LLR, relative to cells that are determined to be near the threshold. Those skilled in the art will appreciate that it is the relative value of the LLR between cells, and not the absolute value of the LLR values, that is relevant to probabilistic ECC methods. After a memory cell has been sensed (e.g., at the first strobe signal), the cell may be inhibited so that the memory cell will not be sensed during subsequent strobes, and the current drawn by the already sensed memory cell will not create noise that can affect memory cells that may be sensed, during subsequent strobe signals. The strobe signal generator 338 may be configured to generate a second strobe signal at a second time. Between the first strobe signal and the second strobe signal, additional memory cells that are nearer the transition voltage between logic states may have sufficiently discharged to the trip point of the sense latch 332. These memory cells may be detected by the second strobe signal. Those memory cells that are detected by the second strobe signal may be associated with probabilistic information indicating that the memory cells are detected at a particular logic level, but there is a relatively high probability (compared to those memory cells detected by the first strobe signal) that the memory cells detected by the second strobe signal contain an error that must be corrected during an LDPC decode operation. Accordingly, the second value may be a relatively low LLR value.

Although two, strobe signals are described above, additional strobe signals may be used to generate more precisely defined regions into which the cells may be divided. For example, three strobes may be used to define three regions, a high LLR region, a mid-LLR region, and a low LLR region. For MLCs, additional strobe signals may be used to detect thresholds between the multiple logic states. An example of sensing MLCs configured to store two bits is described below with respect to FIGS. 4-7.

Figure 4:
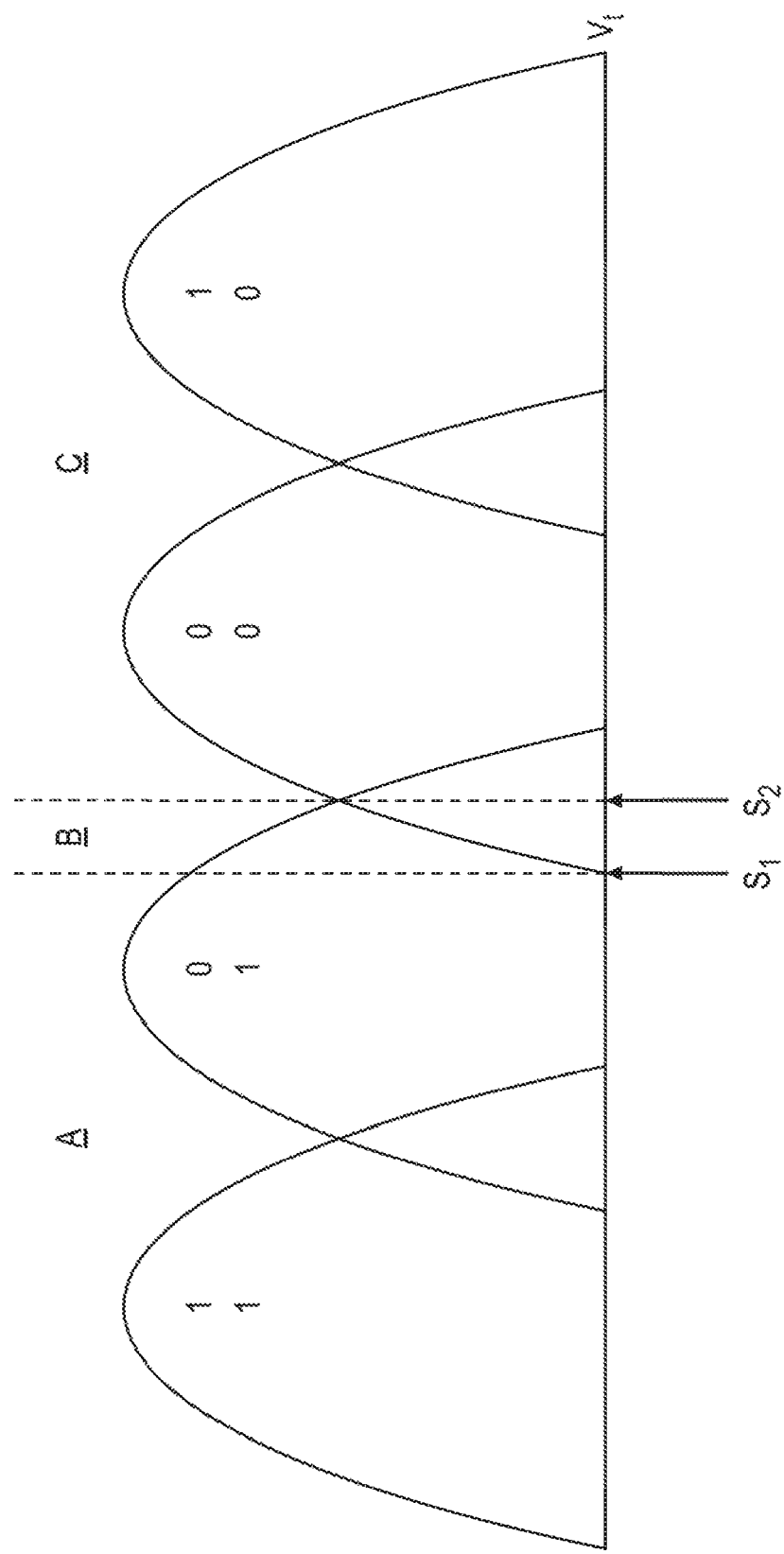
FIG. 4 is a graph illustrating generating one-sided probabilistic information for a lower page of a two bit multilevel memory cell, in accordance with an embodiment of the present invention.

FIG. 4 is a graph of threshold voltages of a two bit multilevel memory cell, in accordance with an embodiment of the present invention. The horizontal axis of the graph represents the threshold voltage of the memory cell. The vertical axis has arbitrary units associated with the probability of the memory cell being in a given logic state with certain threshold voltage. FIG. 4 shows four regions. Each region is associated with a different logic state of a memory cell configured to store two bits. The four possible logic states are 11, 01, 00, and 10. The memory cell may be considered to have two pages: an upper page and a lower page. Each page is associated with one bit of the memory cell and may have either a logic value of 0 or 1. As used herein, when referring to a two bit memory cell, the upper page logic value is the first logic value and the lower page logic value is the second logic value. Each logic state is illustrated as a curve having a relatively high central region and relatively low regions near the boundaries between logic states. The height of the curve is associated with the probability that the memory cell is in that particular logic state.

FIG. 4 further includes two strobe signals taken at two different times corresponding to sensing the cells having two different threshold voltages, $S_1$ and $S_2$, which correspond to the particular logic state of the memory cell. In the embodiment of FIG. 4, the strobe signals are configured to determine the relative likelihood that the lower page of the memory cell has a logic value of 1. That is, the two strobe signals $S_1$ and $S_2$ may determine the likelihood that the memory cell is in one of the logic states 11 or 01. Strobe signals configured to detect the logic value of an upper page are described in further detail below with respect to FIGS. 6 and 7. As described above with respect to FIG. 3, strobe signals may be timed to detect different threshold voltages of memory cells, which correspond to different logical states. With reference to FIG. 4, the first strobe signal $S_1$ may be part of a coarse sense operation that detects whether the memory cell has a high probability of having a lower page bit with a logic value of 1. If the threshold voltage of the memory cell is below the sense voltage (i.e., Region A in FIG. 4), then the memory cell may be considered to have a high probability of being in one of the states 11 or 01. A high LLR value indicative of that result may be associated with the memory cell.

If the memory cell has not sufficiently discharged by the first strobe signal $S_1$, then a second strobe signal $S_2$ may be used to sense the memory cell a second time. The second strobe signal $S_2$ may be timed to sense cells that have a threshold voltage that is at or near the transition voltage between the logic states 01 and 00. Because the second strobe signal $S_2$ can only sense cells that have thresholds below the $S_2$ voltage and the memory cells having thresholds less than the first strobe signal voltage $S_1$ are inhibited during the second strobe signal, the only memory cells detected during the second strobe signal are in region B of FIG. 4. Because these memory cells are near the transition voltage between logic states 01 and 00, there is a greater probability that the memory cell is erroneous (e.g., that the memory cell is sensed in logic state 01, but should be sensed as logic state 00). Therefore, a relatively low LLR value may be assigned to the sensed memory cell. The low LLR value may be used during an LDPC operation to correct one or more erroneous bits in requested data. Those memory cells that were not detected during one of the first strobe signal $S_1$ and the second strobe signal $S_2$ may be considered to be in region C of FIG. 4 and have a lower page logic value of 0 (i.e., either in logic state 00 or 10).

In some embodiments, the memory array (e.g., memory array 112 or 212) may be configured to count and store the number of memory cells that are determined to be in region B (i.e., at or near the transition voltage between logic states and therefore more likely to be erroneous). The number of memory cells in region B may be stored in a counter circuit (e.g., counter circuit 116 or 216). The number of cells determined to be in region B may be compared to a predetermined threshold number of memory cells. If the number of memory cells in region B exceeds the threshold number of memory cells, then an additional sense operation may be performed to generate two-sided probabilistic information for a given transition voltage between logic states by detecting cells that are near the transition voltage between logic states, but have a greater threshold voltage than the second strobe signal $S_2$.

Figure 5:
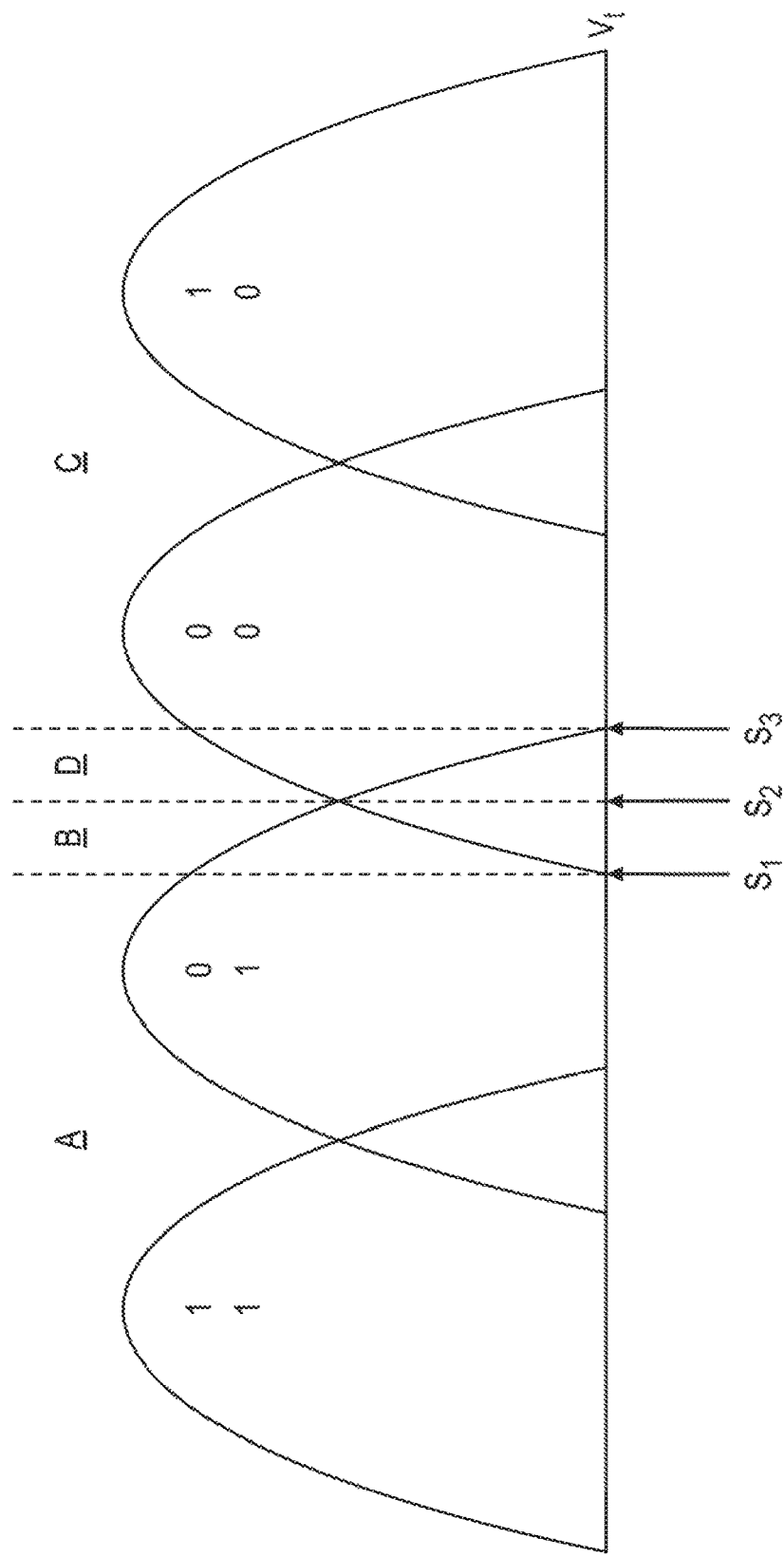
FIG. 5 is a graph illustrating generating two-sided probabilistic information for a lower page of a two bit multilevel memory cell, in accordance with an embodiment of the present invention.

FIG. 5 is a graph illustrating generating two-sided probabilistic information for a lower page of a two bit multilevel memory cell, in accordance with an embodiment of the present invention. When the number of memory cells determined to be in Region B by the second strobe signal exceeds the threshold number of memory cells, the memory cells in region B may also be inhibited, and a third strobe signal $S_3$ may be generated to sense memory cells having a threshold voltage between the second strobe signal voltage $S_2$ and the third strobe signal voltage $S_3$. The value strobe signal voltage $S_3$ may be selected to be above the transition voltage between the logic states 01 and 00 in region D of FIG. 5. Accordingly, those memory cells that are detected by the third strobe signal are sensed as being in logic state 00, but there is an increased probability that one or more of the sensed memory cells is erroneous. Therefore, a relatively low LLR may be associated with the memory cells sensed during the third strobe signal $S_3$. The LLR may be used during an LDPC decode operation to correct one or more erroneous bits in the sensed memory cells. The probabilistic information generated by the third strobe signal $S_3$ may be considered "two-sided" probabilistic information because the memory cells detected during the three strobe signals provide information for cells on both sides of the transition voltage between logic states that may have an increased probability of being erroneous.

Figure 6:
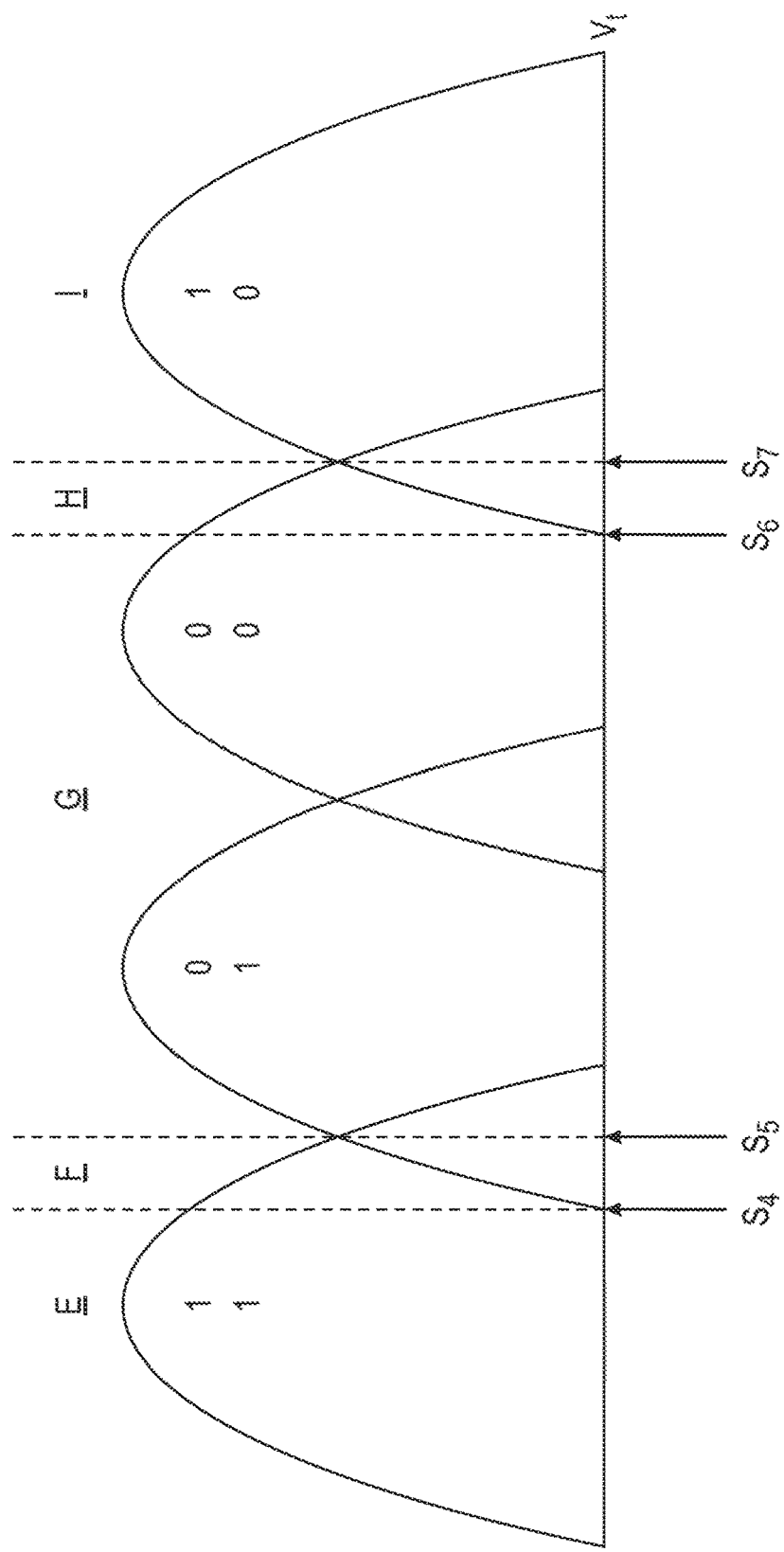
FIG. 6 is a graph illustrating generating one-sided probabilistic information for an upper page of a two bit multilevel memory cell, in accordance with an embodiment of the present invention.

FIG. 6 is a graph illustrating generating one-sided probabilistic information for an upper page of a two bit multilevel memory cell, in accordance with an embodiment of the present invention. The general operations for generating one-sided information for an upper page of a two bit multilevel memory cell are similar to those discussed above with respect to the lower page in FIG. 4. However, the logic states of the memory cell may be defined such that two separate thresholds must be detected to generate the probabilistic information. That is, a first transition voltage between logic states 11 and 01 may have a first threshold voltage, and a second transition voltage between logic states 00 and 10 may have a second threshold voltage. Accordingly, a total of four strobe signals $S_4$-$S_7$ may be generated to sense the memory cell and generate the probabilistic information. Similar to FIG. 4, the fourth strobe signal $S_4$ may detect those memory cells having a threshold below the fourth strobe signal voltage $S_4$. Those memory cells detected by the fourth strobe signal $S_4$ (e.g., those in region E of FIG. 6) may be associated with a relatively high LLR indicating that the memory cells are unlikely to be erroneous. The detected memory cells may be inhibited to prevent their detection during subsequent strobe signals.

A fifth strobe signal $S_5$ may be generated to detect those memory cells having a cell threshold between the fourth strobe signal voltage $S_4$ and the fifth strobe signal voltage $S_5$ (i.e., in region F in FIG. 6). Those memory cells detected by the fifth strobe signal $S_5$ may be associated with a relatively low LLR indicating that the detected memory cells are at or near the transition voltage between the logic states 11 and 01, and may be erroneous and in need of correction during an LDPC decode operation. As with the lower page, the number of cells in region F may be counted and compared to a threshold number of memory cells. If the number of memory cells in region F is greater than the threshold, then an additional sense operation may be performed to generate two-sided probabilistic information as discussed below with respect to FIG. 7. Once detected, those memory cells in region F may be inhibited so that they are not detected during subsequent strobe signals A sixth strobe signal $S_6$ may be generated to detect those memory cells between the strobe signal voltage $S_5$ and the strobe signal voltage $S_6$ (i.e., in region G in FIG. 6). That is, the detected cells are sensed to have an upper page logic value of 0 (i.e., either in logic state 01 or 00). Those memory cells detected by the sixth strobe signal $S_6$ may be associated with an LLR indicating that the memory cells are unlikely to be erroneous because their detected cell thresholds are not near the transition voltage between the logic states 00 and 01. The cells detected during the sixth strobe signal $S_6$ may be inhibited to prevent them from being sensed during subsequent strobe signals. A seventh strobe signal $S_7$ may be generated to detect memory cells having a threshold voltage between the sixth strobe signal voltage $S_6$ and the seventh strobe signal voltage $S_7$ (i.e., in region H in FIG. 7). The detected memory cells may be associated with a relatively low LLR value indicating that the detected memory cells may be erroneous because they have a threshold voltage that is at or near the transition voltage between the logic states 00 and 01. Additionally, the number of memory cells detected by the seventh strobe signal $S_7$ may be counted and compared to a threshold number of memory cells. If the number of memory cells exceeds the threshold number of memory cells, then an additional sense operation may be performed to generate two sided probabilistic information as discussed below with respect to FIG. 7

Figure 7:
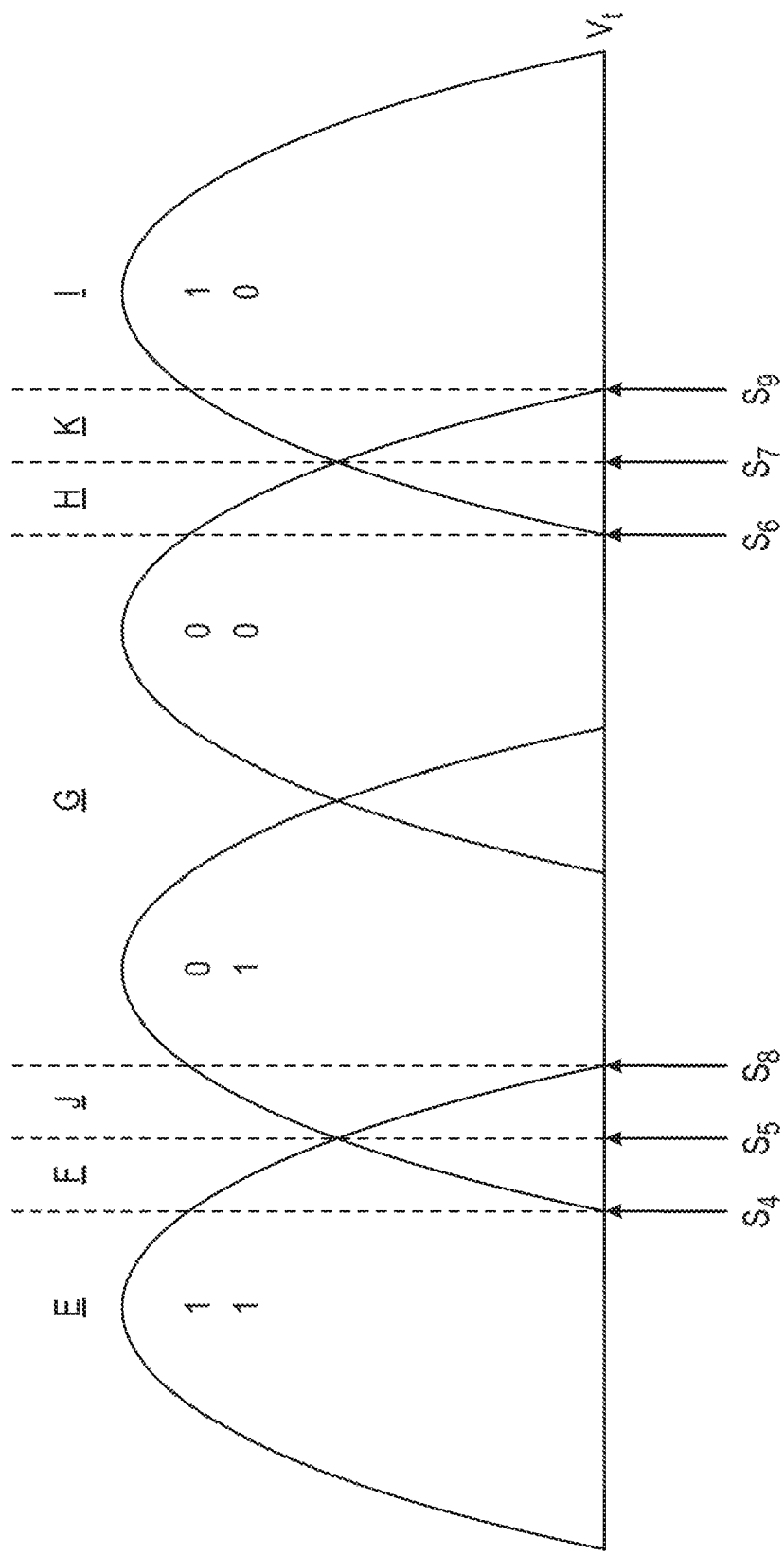
FIG. 7 is a graph illustrating generating two-sided probabilistic information for an upper page of a two bit multilevel memory cell, in accordance with an embodiment of the present invention.

FIG. 7 is a graph illustrating generating two-sided probabilistic information for an upper page of a two bit multilevel memory cell, in accordance with an embodiment of the present invention. As discussed above, if the number of memory cells detected within regions F and/or H exceeds a threshold number of memory cells, then additional sense operations may be performed to generate two-sided probabilistic information for the memory cells. For example, if the number of memory cells determined to be in region F exceeds the threshold number of memory cells, then an eighth strobe signal may be generated to detect memory cells having thresholds between the fifth strobe signal voltage $S_5$ and the eighth strobe signal voltage $S_8$ (i.e., region J in FIG. 7). Those memory cells that are determined to have threshold voltages in region J may be sensed as being in logic state 01 and associated with an LLR value that indicates that the detected cells may be erroneous and require correction during an LDPC decode operation. Similarly, if the number of memory cells determined to be in region H exceeds the threshold number of memory cells, then a ninth strobe signal $S_9$ may be generated to detect memory cells having threshold voltages between the seventh strobe signal voltage $S_7$ and the ninth strobe signal voltage $S_9$ (i.e., in region K in FIG. 7). The memory cells in region K may be sensed as being in logic state 10 and be associated with an LLR value indicating that the memory cells may be erroneous and require correction during an LDPC decode operation. Those memory cells not detected during the sense operations are considered to be in logic state 10 and are associated with an LLR value indicating that the memory cells are unlikely to be erroneous.

Figure 8:
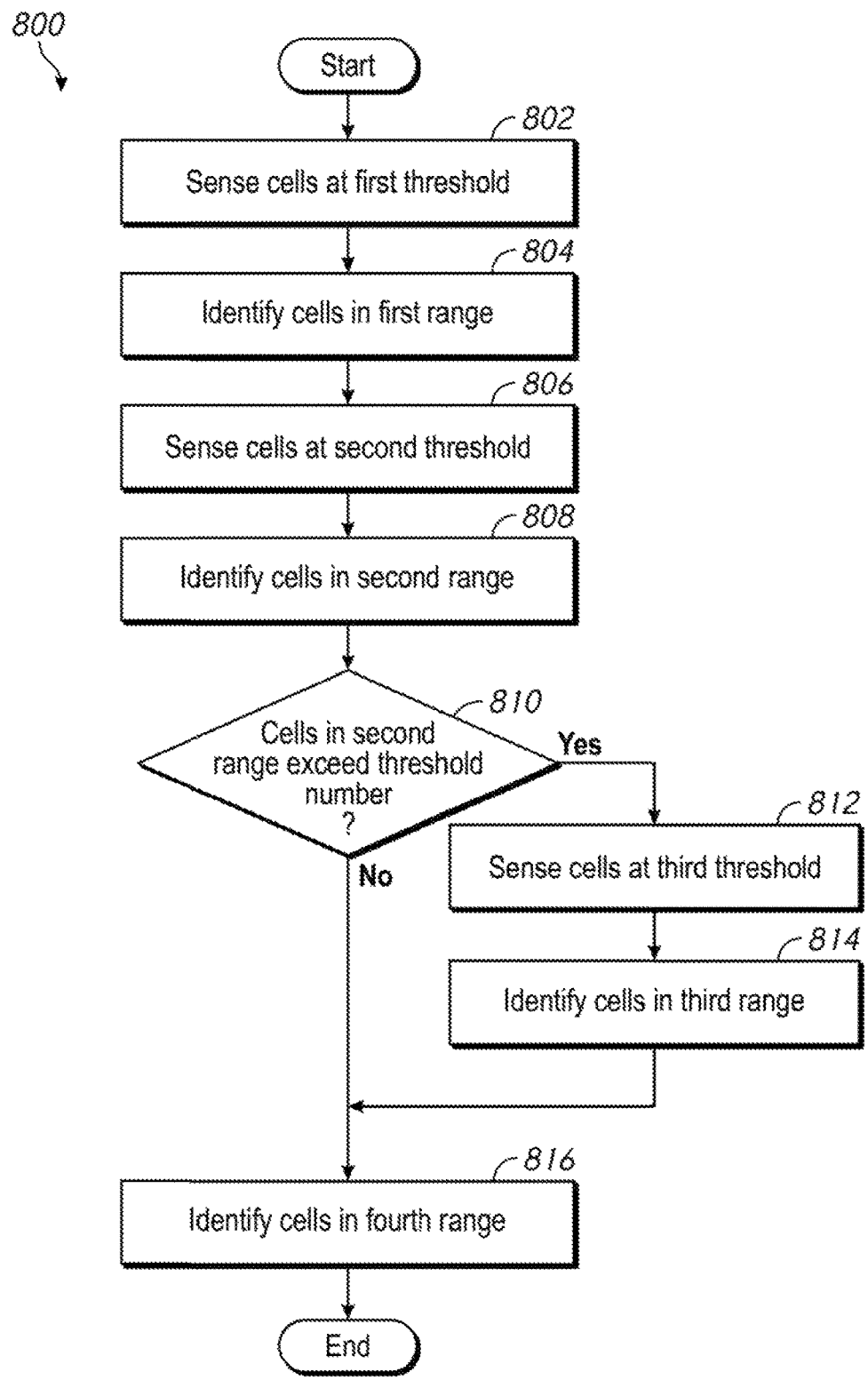
FIG. 8 illustrates a method for generating probabilistic information using current integration, in accordance with an embodiment of the present invention.

FIG. 8 illustrates a method, generally designated 800, for identifying memory cells falling within different threshold ranges using current integration, in accordance with an embodiment of the present invention. In general, the ranges identified in the operations of the method 800 may be used to assign one-sided and/or two-sided probabilistic information for a transition voltage between two logic states in a memory cell. For example, in the embodiments of FIGS. 4-7, the method 800 may be used to identify cells in different ranges to generate one-sided and/or two-sided probabilistic information between the logic states of 11 and 01, 01 and 00, and/or 00 and 10. The information generated by the method 800 may be used in a probabilistic ECC decode operation, such as an LDPC decode operation or other error correction method that can utilize soft input information to correct errors in a received codeword. For purposes of clarity and simplicity, the operations of the method 800 are discussed with reference to the memory array 212 of FIG. 2 and the sense operations of FIG. 5 that detect the lower page logic value of a two bit MLC.

In operation 802, the sense circuit 214 senses the memory cells 202 at a first threshold. For example, the sense circuit 214 may generate a first strobe signal $S_1$ configured to detect memory cells 202 having thresholds below first strobe signal voltage $S_1$ (i.e., region A in FIG. 5). The first strobe signal $S_1$ may have a first strobe signal voltage that is below the threshold voltage between the logic states 01 and 00. In operation 804, the sense circuit 214 identifies cells that fall in a first range of threshold voltages and the sensed cells may be inhibited such that they are not detected during future sense operations. The identified cells may, for example, have a voltage stored thereon that is less than the voltage of the first threshold. In some embodiments, the controller circuit 106 may assign soft information, such as an LLR value or other probabilistic information to the cells identified in operation 804. In embodiments where the strobe signal voltage is below the threshold voltage between the logic states 01 and 00, the LLR value may indicate that the sensed cells are unlikely to be erroneous and therefore, are unlikely to require correction during a subsequent LDPC decode operation.

In operation 806, the sense circuit 214 senses the memory cells 202 at a second threshold. Because the memory cells sensed at the first threshold were inhibited, those cells are not detected at the second threshold. For Example, the sense circuit 214 may generate a second strobe signal $S_2$ to detect memory cells having thresholds between the first strobe signal voltage $S_1$ and the second strobe signal voltage $S_2$ (i.e., regions B in FIG. 5). In some embodiments, the second threshold may be at or near the threshold voltage between the logic states 01 and 00. That is, the sense operation of operation 806 detects those memory cells that have voltages stored thereon that are near the threshold between logic states, and therefore are more likely to require correction during a decode operation. In operation 808, the sense circuit 214 identifies the cells that call in a second range of threshold voltages. For example, the sense circuit 214 may identify those cells that were sensed in operation 806 and have voltages stored thereon that are between the first threshold and the second threshold. In some embodiments, the controller circuit 106 may assign soft information, such as an LLR value or other probabilistic information to the cells identified in operation 806. For example, the control circuit 106 may assign an LLR value indicating that there is an increased likelihood that the cells identified in the second range will require correction during an ECC decode operation. Additionally, the sensed cells may be inhibited to prevent them from being detected during a subsequent sense operation.

In decision block 810, the sense circuit may determine whether the number of cells identified as falling in the second range in operation 808 exceeds a threshold number of memory cells. In the embodiment of FIG. 2, the number of cells that are identified as falling in the second range in operation 808 may be counted and stored in the counter circuit 216. The value stored in the counter circuit 216 may be compared to a predetermined threshold number of cells to determine whether additional sensing should be performed to generate more precise probabilistic information for memory cells having thresholds near the transition voltage between the logic states 01 and 00. If the number of memory cells that were identified as falling in the second range exceeds the threshold number of cells (decision block 810, YES branch), then the memory cells 202 are sensed at a third threshold in operation 812. Because the memory cells 202 that were detected during the first two sense operations in operations 802 and 806 were inhibited, those cells are not sensed by the third sense operation. For example, the sense circuit 212 may generate a third strobe signal $S_3$ to detect memory cells 202 that have thresholds between the second strobe signal voltage $S_2$ and the third strobe signal voltage $S_3$ (i.e., region D in FIG. 5).

In operation 814, the sense circuit 212 identifies those memory cells that fall within a third range. For example, the sense circuit 202 may identify those memory cells that that have a voltage stored thereon that is between the second threshold and the third threshold. For example, the identified memory cells may have voltages stored thereon that are between the second strobe signal voltage $S_2$ and the third strobe signal voltage $S_3$. The control circuit 106 may assign an LLR value, or other soft information, to the memory cells identified in operation 814. The third LLR value may be probabilistic information indicating that the memory cells 202 detected during the third sense operation may be erroneous and may require correction during an LDPC decode operation. In operation 816, the remaining memory cells (e.g., those not detected in operations 802-814) are identified as falling in a fourth range. The control circuit 106 may assign a fourth LLR value is assigned to the remaining memory cells 202 that were not detected during any of the first, second, or third sense operations. The fourth LLR value may indicate that the remaining memory cells 202 have a lower page logic value of 0 and that the memory cells 202 are unlikely to be erroneous.

Figure 9:
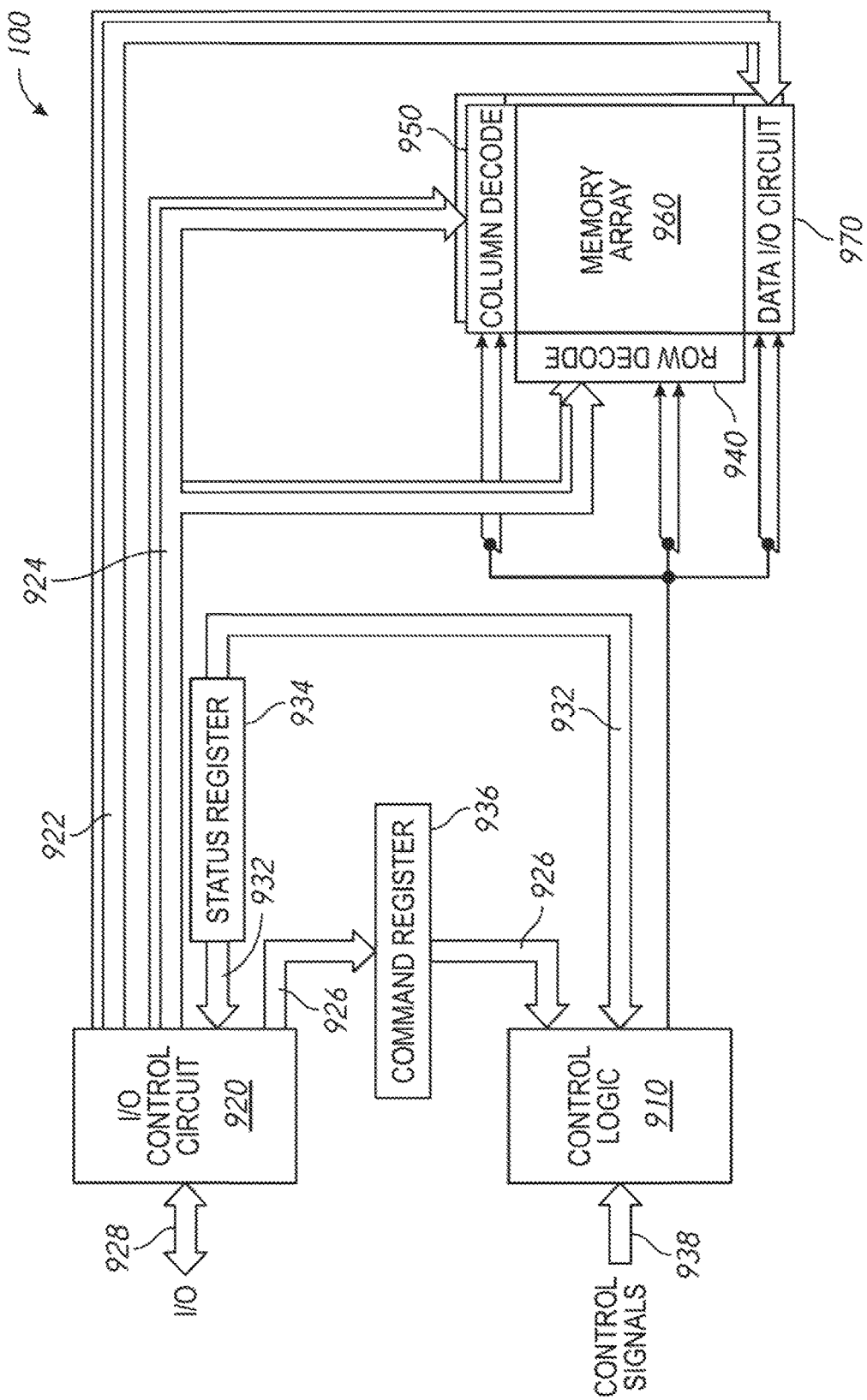
FIG. 9 is a block diagram of a memory, in accordance with an embodiment of the present invention.

FIG. 9 illustrates an apparatus that includes a memory device 100 according to an embodiment of the present invention. The memory device 100 includes a memory array 960 with a plurality of memory cells that are configured to store data. The memory cells may be accessed in the array through the use of various signal lines, word lines (WLs), and/or bit lines (BLs). The memory cells may be non-volatile memory cells, such as NAND or NOR flash cells, phase change memory cells, or may generally be any type of memory cells. The memory cells of the memory array 960 can be arranged in a memory array architecture. For example, in one embodiment, the memory cells are arranged in a 3D cross-point architecture. In other embodiments, other memory array architectures may be used, for example, a single-level cross-point architecture, among others. The memory cells may be single level cells configured to store data for one bit of data. The memory cells may also be multi-level cells configured to store data for more than one bit of data.

A data strobe signal DQS may be transmitted through a data strobe bus (not shown). The DQS signal may be used to provide timing information for the transfer of data to the memory device 100 or from the memory device 100. The I/O bus 928 is connected to an I/O control circuit 920 that routes data signals, address information signals, and other signals between the I/O bus 928 and an internal data bus 922, an internal address bus 924, and/or an internal command bus 926. An address register 925 may be provided address information by the I/O control circuit 920 to be temporarily stored. The I/O control circuit 920 is coupled to a status register 934 through a status register bus 932. Status bits stored by the status register 934 may be provided by the I/O control circuit 920 responsive to a read status command provided to the memory device 100. The status bits may have respective values to indicate a status condition of various aspects of the memory and its operation.

The memory device 100 also includes a control logic 910 that receives a number of control signals 938 either externally or through the command bus 926 to control the operation of the memory device 100. The control signals 938 may be implemented with any appropriate interface protocol. For example, the control signals 938 may be pin based, as is common in dynamic random access memory and flash memory (e.g., NAND flash), or op-code based. Example control signals 938 include clock signals, read/write signals, clock enable signals, etc. A command register 936 is coupled to the internal command bus 926 to store information received by the I/O control circuit 920 and provide the information to the control logic 910. The control logic 910 may further access a status register 934 through the status register bus 932, for example, to update the status bits as status conditions change. The control logic 910 may be configured to provide internal control signals to various circuits of the memory device 100. For example, responsive to receiving a memory access command (e.g., read, write), the control logic 910 may provide internal control signals to control various memory access circuits to perform a memory access operation. The various memory access circuits are used during the memory access operation, and may generally include circuits such as row and column decoders, charge pump circuits, signal line drivers, data and cache registers, I/O circuits, as well as others.

The address register 925 provides block-row address signals to a row decoder 940 and column address signals to a column decoder 950. The row decoder 940 and column decoder 950 may be used to select blocks of memory cells for memory operations, for example, read and write operations. The row decoder 940 and/or the column decoder 950 may include one or more signal line drivers configured to provide a biasing signal to one or more of the signal lines in the memory array 960. The column decoder 950 and/or the row decoder 940 may include sense circuits, such as sense circuit 114, 214, and/or 314, that are configured to sense one or more memory cells of the memory array 960 and generate probabilistic information associated with the memory cells of the memory array 960 for use during ECC decode operations, as described above with respect to FIGS. 1-8.

A data I/O circuit 970 includes one or more circuits configured to facilitate data transfer between the I/O control circuit 920 and the memory array 960 based on signals received from the control logic 910. In various embodiments, the data I/O circuit 970 may include one or more registers, buffers, and other circuits for managing data transfer between the memory array 960 and the I/O control circuit 920. For example, during a write operation, the I/O control circuit 920 receives the data to be written through the I/O bus 928 and provides the data to the data I/O circuit 970 via the internal data bus 922. The data I/O circuit 970 writes the data to the memory array 960 based on control signals provided by the control logic 910 at a location specified by the row decoder 940 and the column decoder 950. During a read operation, the data I/O circuit reads data from the memory array 960 based on control signals provided by the control logic 910 at an address specified by the row decoder 940 and the column decoder 950. The detail I/O circuit provides the read data to the I/O control circuit via the internal data bus 922. The I/O control circuit 920 then provides the read data on the I/O bus 928.

Those of ordinary skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Skilled artisans may implement the described functionality in varying ways for each particular application, but such implementation decisions should not be interpreted as causing a departure from the scope of the present disclosure.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope, of the disclosure. Thus the present disclosure is not intended to be limited to the embodiments shown herein but is to be accorded the widest scope possible consistent with the principles and novel features as previously described.

What is claimed is:

1. A method comprising:
sensing, responsive to a trip point selector instructing a current detector, a first set of memory cells from a plurality of memory cells at a first sense threshold;
responsive to sensing the first set of memory cells of the plurality of memory cells, identifying, via a sense latch, the first set of memory cells as having a voltage stored thereon within a first range of voltages;
sensing, responsive to the trip point selector instructing the current detector, a second set of memory cells from the plurality of memory cells at a second sense threshold, wherein the first set of memory cells are undetected by the sensing of the second set of memory cells;
responsive to sensing the second set of memory cells of the plurality of memory cells, identifying, via the sense latch, the second set of memory cells as having a voltage stored thereon within a second range of voltages; and
performing, via a decoder circuit communicatively coupled to the current detector, an error correction operation on the first and second sets of memory cells based, at least in part, on the first and second ranges of voltages.

2. The method of claim 1, further comprising:
determining a number of memory cells in the second set of memory cells;
comparing the number of memory cells in the second set of memory cells to a threshold;
responsive to the number of memory cells in the second set of memory cells exceeding the threshold, sensing a third set of memory cells from the plurality of memory cells based on a third sense threshold; and
identifying a portion of the third set of memory cells having a voltage stored thereon within a third range of voltages.

3. The method of claim 1, further comprising:
associating first probabilistic information with the first set of memory cells;
associating second probabilistic information with the second set of memory cells, wherein the first probabilistic information is indicative of a likelihood that data in the first set of memory cells are erroneous and the second probabilistic information is indicative of a likelihood that data in second set of memory cells are erroneous.

4. The method of claim 3, wherein at least one of the first probabilistic information and the second probabilistic information comprises a log-likelihood ratio.

5. The method of claim 1, wherein the error correction operation includes a soft-input ECC decode operation.

6. A method comprising:
performing a first sense operation at a first time, responsive to a trip point selector instructing a current detector;
responsive to the first sense operation, detecting via a detector circuit that a first memory cell has a threshold voltage below a first sense voltage;
responsive to determining the threshold voltage of the first memory cell is below the first sense voltage, generating, via a sense circuit, probabilistic information associated with the first memory cell;
performing, via a decoder circuit communicatively coupled to the current detector, an error correction operation on the first memory cell based, at least in part, on the probabilistic information;
performing a second sense operation at a second time, responsive to the trip point selector instructing the current detector, the second time being later than the first time, wherein the first memory cell is undetected by the second sense operation;
responsive to the second sense operation, detecting, via the detector circuit, that a second memory cell has a threshold voltage greater than the first sense voltage and below a second sense voltage; and
responsive to determining that the threshold voltage of the second memory cell is greater than the first sense voltage and below the second sense voltage, generating, via the sense circuit, second probabilistic information associated with the second memory cell.

7. The method of claim 6, wherein the second probabilistic information is indicative of the second memory cell having a higher probability of being erroneous than the first memory cell.

8. The method of claim 7, wherein each of the first memory cell and the second memory cells is a multilevel memory cell.

9. The method of claim 7, wherein second sense threshold is indicative of a transition voltage between two logic states of the second memory cell.

10. An apparatus comprising:
a plurality of memory cells, each memory cell configured to store a plurality of logic states;
a sense circuit configured to determine a number of the plurality of memory cells that have a first cell threshold within a first range of a transition voltage between the logic states, wherein the plurality of memory cells that have the first cell threshold are undetected when determining a number of the plurality of memory cells having a second cell threshold within a second range of the transition voltage between the logic states; and
a counter circuit configured to store the number of the plurality of memory cells having a second cell threshold within the second range of the transition voltage between the logic states.

11. The apparatus of claim 10, a control circuit configured to associate the first memory cell with first probabilistic information based on the first cell threshold being within the first range of the transition voltage between the logic states, and the second memory cell with second probabilistic information based on the second cell threshold being within the second range of the transition voltage.

12. The apparatus of claim 10, wherein the counter circuit is further configured to determine whether the number of the plurality of memory cells having the second cell threshold exceeds a threshold.

13. The apparatus of claim 11, further comprising:
a control circuit configured to perform an error correcting code decode operation on the first memory cell based, at least in part, on the first probabilistic information and on the second memory cell based, at least in part, on the second probabilistic information.

14. The apparatus of claim 13, wherein the error correcting code has support for soft-input decoding.

15. The apparatus of claim 10, wherein the sense circuit is configured to determine the number of the plurality of memory cells that have the first cell threshold within the first range of the transition voltage between the logic states and the number of the plurality of memory cells having the second cell threshold within the second range of the transition voltage using current integration.

16. A method comprising:
performing, responsive to a trip point selector instructing a current detector, a coarse sense operation on a plurality of memory cells, wherein the coarse sense operation detects, via a sense latch, a first subset of memory cells having a first logic state;
associating, via a sense circuit, first probability information with the first subset of memory cells;
performing, responsive to the trip point selector instructing the current detector, a fine sense operation on the plurality of memory cells, wherein the fine sense operation detects, via the sense latch, a second subset of memory cells having the first logic state the first subset of memory cells are undetected during the fine sense operation;
associating, via the sense circuit, second probability information with the second subset of memory cells; and
performing, via a decoder circuit communicatively coupled to the current detector, error correction on the plurality of memory cells based, at least in part on the first probability information and the second probability information.

17. The method of claim 16, wherein the coarse sense operation and the fine sense operation detect a logic state of a lower page of a multilevel memory cell.

18. The method of claim 16 further comprising:
performing a second coarse sense operation on the plurality of memory cells, wherein the second coarse sense operation detects a third subset of memory cells having a second logic state;
associating third probability information with the third subset of memory cells;
performing a second fine sense operation on the plurality of memory cells, wherein the second fine sense operation detects a fourth subset of memory cells having the second logic state; and
associating fourth probability information with the fourth subset of memory cells.

19. The method of claim 18, further comprising:
performing a third coarse sense operation on the plurality of memory cells, wherein the third coarse sense operation detects a fifth subset of memory cells having a third logic state;
associating fifth probability information with the fifth subset of memory cells;
performing a third fine sense operation on the plurality of memory cells, wherein the third fine sense operation detects a sixth subset of memory cells having the third logic state; and
associating sixth probability information with the sixth subset of memory cells.

20. The method of claim 19, further comprising:
identifying a seventh subset of memory cells, wherein the seventh subset of memory cells have a fourth logic state; and
associating seventh probability information with the seventh subset of memory cells.

21. The method of claim 20, wherein performing the error correction is further based on the third probability information, the fourth probability information, the fifth probability information, the sixth probability information, and the seventh probability information.

22. The method of claim 19, wherein the second coarse sense operation and the third coarse sense operations and the second fine sense operation and the third fine sense operations detect a logic state of an upper page of a multilevel memory cell.

* * * * *